United States Patent [19]

Vries

[11] Patent Number: 4,541,095
[45] Date of Patent: Sep. 10, 1985

[54] SYSTEM FOR COMMUNICATION BY WAY OF REPEATEDLY TRANSMITTED MESSAGES, AND STATIONS FOR USE IN SUCH A SYSTEM

[75] Inventor: Lodewijk B. Vries, Eindhoven, Netherlands

[73] Assignee: U.S. Philips Corporation, New York, N.Y.

[21] Appl. No.: 465,742

[22] Filed: Feb. 11, 1983

[30] Foreign Application Priority Data

Feb. 15, 1982 [NL] Netherlands .......................... 8200560

[51] Int. Cl.³ ...................... G06F 11/08; G06F 11/14
[52] U.S. Cl. .......................................... 371/69; 371/37
[58] Field of Search ...................... 371/36, 37, 30, 48, 371/49, 69

[56] References Cited

U.S. PATENT DOCUMENTS

| | | | |
|---|---|---|---|
| 3,439,329 | 4/1969 | Betz et al. | 371/37 |
| 3,609,682 | 9/1971 | Mitchell | 371/37 |
| 3,639,901 | 2/1972 | Mitchell | 371/37 |
| 3,700,886 | 10/1972 | Birkin | |
| 3,863,215 | 1/1975 | McGrogan | 371/69 |
| 4,215,335 | 7/1980 | Doi et al. | 371/69 |
| 4,360,918 | 11/1982 | Ruhnau et al. | 371/69 |

OTHER PUBLICATIONS

Peterson and Weldon, Error Correcting Codes, The MIT Press, 1972.

*Primary Examiner*—Jerry Smith
*Assistant Examiner*—Mark Ungerman
*Attorney, Agent, or Firm*—Thomas A. Briody; William J. Streeter

[57] ABSTRACT

A description is given of a system for communication between a transmitting station (30) and a receiving station (33) by way of a message which consists of a direct succession of a number of identical code words. Each message uses only a comparatively small part of the capacity of the message channel. Each code word has at least a predetermined minimum Hamming distance with respect to any other code word, including the cyclic transpositions of the latter code word. Therefore, for the detection and reproduction of a code word it is not necessary to realize word synchronization and a given category of errors can still be detected and/or corrected. The code words may concern, for example, a transmitter or program identification in a broadcasting system or a paging code for a receiving station in a system comprising selectively addressable receiving stations as in a paging system.

8 Claims, 10 Drawing Figures

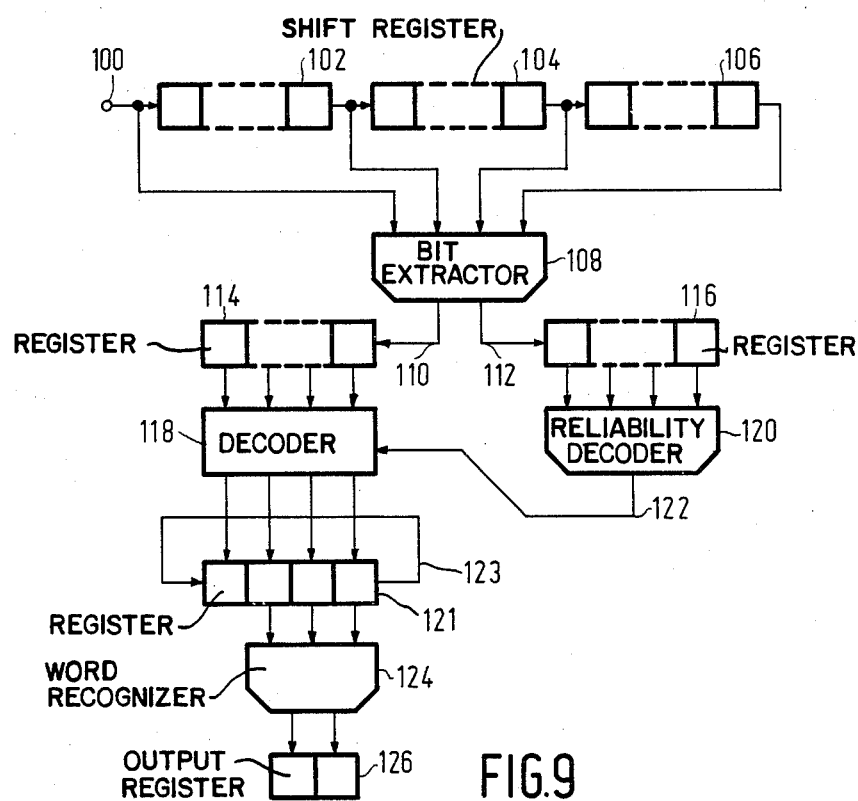

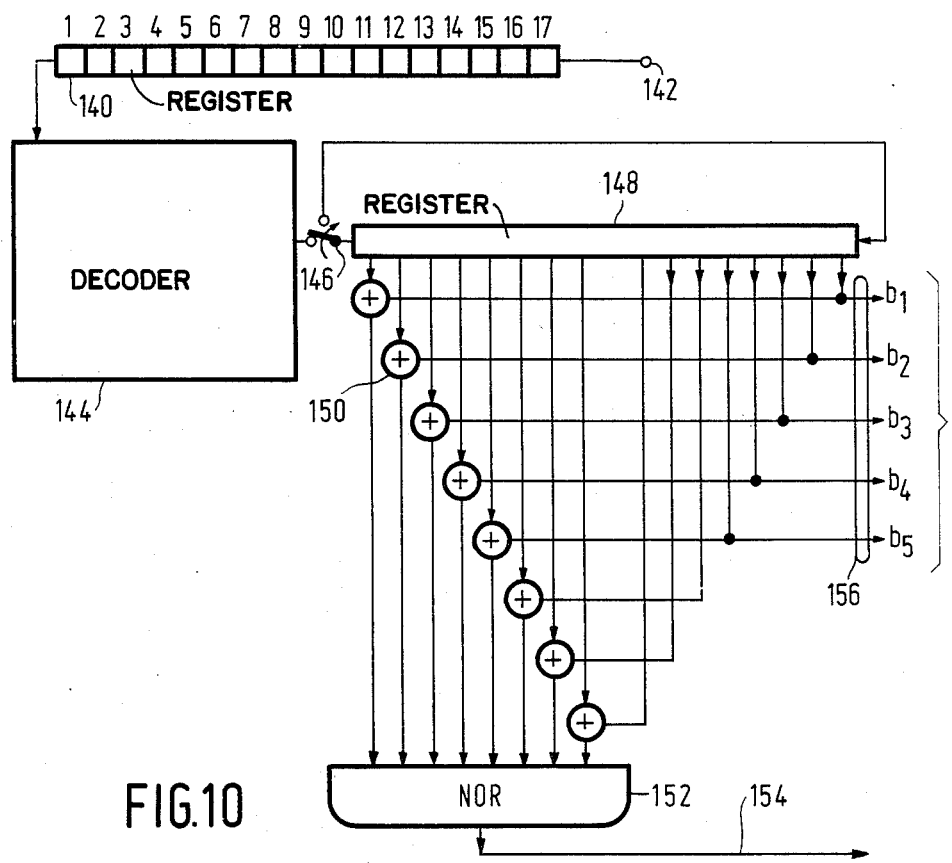

SYSTEM FOR COMMUNICATION BY WAY OF REPEATEDLY TRANSMITTED MESSAGES, AND STATIONS FOR USE IN SUCH A SYSTEM

The invention relates to a system for communication between a transmitting station and a receiving station via a message channel by way of a message which uses a comparatively small part of the transmission capacity of the message channel. The receiving station comprises separation means which are coupled to the message channel in order to separate a message therefrom, and a decoder which is connected to the separation means in order to decode the message and to provide an output indication. Such a system is known from Netherlands Patent Application No. 7800581 in the name of Applicant, published on Aug. 29, 1978 (PHN 8691 C) U.S. Pat. No. 4,252,995 issued Feb. 24, 1981. The known system is a radio broadcasting system which is based on frequency modulation of a carrier wave having a binary code signal modulated on a subcarrier. The code signal provides information as to the identity of the transmitting station, the broadcast channel used, etc. Only a small part of the frequency spectrum of the relevant broadcast channel is used. The information ultimately decoded may be displayed, for example, as 7-segment characters. The code signal is continuously added to the program signal, so that the information associated therewith can be displayed at any instant. The receiver for such a channel may be tuned to the relevant station at an arbitrary instant, so that decoding could commence in the middle of a message. The foregoing also holds when the receiving station is connected to a community aerial system in which frequency conversion may have taken place. Decoding may then also commence at an arbitrary instant. The problem imposed by the arbitrary start of tuning is more significant when the decoded code is used by a microcomputer which is incorporated in the receiving station in order to select a desired program or a desired transmitter. This process takes place, for example, during a search run or scanning sequence during which a frequency range or a predetermined series of transmitter frequencies are searched for the presence of signals of the desired program or the desired transmitter. A system of the kind set forth may also be used in a mobile receiving station which is tuned to a given program which is transmitted by different transmitters (at respective different frequencies simultaneously). During travel of the receiving station, it is checked to see whether it is tuned to the transmitter received most strongly. If not, a switch-over is necessary which is performed fully automatically. Consequently, incorrect decoding of a code message in one of these cases could lead to entirely unjustified control steps. Furthermore, the message may be disturbed, for example, by external influence, so that a bit error occurs. Thus, the object is to provide a code system whereby as many distinct messages as possible can be coded so that from each succession of a number of code elements up to the known length of a code word of n bits the transmitted code word can be decoded, subject to the condition that only a specified, limited category of errors may occur and without a separate synchronization word being required. The use of such a synchronization word per se would mitigate the decoding problem, but the addition of such a word would delay the interrogation process. Moreover, the synchronization word may also be disturbed and be irrecognizable, in some cases. Due to the delay of the interrogation process, the search run through a frequency range may be too long. For example, when the receiving station must output an audio signal at the same time, a listener would experience an annoying interruption.

A second category of systems of the kind set forth is formed by selectively activating or so-called paging systems. As in the above case, such a system comprises a transmitting station and one or more receiving stations up to a predetermined maximum number all of which operate on the same broadcast frequency band. The transmitting station is capable of transmitting a number of different messages, each of the receiving stations being adapted to recognize only one or more "own" messages in order to become active, for example, by producing an audio signal. In that case the broadcast band is used only for a small part of the time; moreover, the transmission capacity of the broadcast band may be so small that only one message can be simultaneously transported. Thus, in that case a number of receivers are simultaneously in the alert condition and all receivers check the transmitted message. In order to enhance the reliability, the code word may be transmitted a fixed number of times in direct succession, for example, three times or ten times. Again the object is to obtain the maximum number of selectable code words within a fixed, limited length of the message which could be disturbed.

SUMMARY OF THE INVENTION

The object is achieved in accordance with the invention in that the transmitting station forms a message as a succession of $p>1$ mutually identical code words of $n>1$ bits each, said message being applied to the message channel, a code word having a given minimum Hamming distance $\geq 2$ with respect to any other permissible code word, including the latter's cyclic transpositions, so that at least one predetermined error can be detected. The decoder of the receiving station comprises decision means for indicating a code word for a separated n-bit word. When a non-correctable error is detected in a separated n-bit word, a new attempt can be made to reconstruct a code word by separation of a next, shifted, n-bit word. The indication of a code word may be implicit or explicit. In the case of transmitter coding it may be that the same receiving station must be capable of decoding many different code words, so that a translation step will be required. A selectively addressable receiver often need recognize only one or two code words. When the code word is recognized, it can act simply as an "alarm" signal; thus (substantially) fewer bits are concerned than in the code word. In the cited prior art, the message channel concerned is a broadcast channel. This is not a limitation to the present invention. For example, in the case of the selectively addressable stations use can be made of a ring line or even a line which is also used for a other purposes, for example, for power supply.

Preferably, a code word has a minimum Hamming distance in the bit space of at least three bits with respect to any other permissible code word, including its cyclic transpositions. The decision means is capable of correcting at least one bit error in a separated n-bit word. When the minimum Hamming distance equals at least three bits, all single-bit errors can be corrected. When the minimum Hamming distance equals two, all single-bit errors can be detected. It has been found that in the latter case usually a given category of errors can also be corrected; some disturbed code words then have a Hamming distance with respect to a single undisturbed code word (including its cyclic transpositions) which is smaller than for any other code word. The relevant disturbed code word then most likely originates from the undisturbed code word. It is to be noted that the nature of the minimum Hamming distance differs from codes which do not take into account the cyclic shift. In the case of, for example, a code set of 16 code words, there are $\frac{1}{2} \times 16 \times 15 = 120$ different distances which are not zero. However, when the cyclic shifts are also to be taken into account, in the same case there will be 120 sets of code distances which do not comprise an element zero. Each set, taking into account the various cyclic transpositions, comprises at the most as many elements as there are bits in the code word. The minimum Hamming distance of the code is then the smallest element of the sets (120 in this case).

The invention also relates to a transmitting station and a receiving station for use in this system; notably in the case of selectively activatable receiving stations the code need not be linear (i.e. the sum of two code words need not perform a possibly cyclically transposed code word again).

In the case of transmitter/program identification it is advantageous to use a linear code, the decision means then comprising multiplier means for forming, using a parity check matrix, a syndrome value in order to reconstruct a code word from the separated n-bit word and the syndrome value. Complex codes can thus be decoded by means of comparatively simple means.

BRIEF DESCRIPTION OF THE FIGURES

The invention will be described in detail hereinafter with reference to some Figures.

FIG. 3 shows the cyclic equivalence classes for an 8-bit code.

FIG. 7 shows the matrices for a first 17-bit code.

FIG. 8 shows the matrices for a second 17-bit code.

FIG. 9 is a detailed view of a (part of a) decoder.

FIG. 10 shows a second part of such a decoder.

DESCRIPTION OF A SIMPLE SYSTEM

Figures 1, 2, 4, 5, 6:
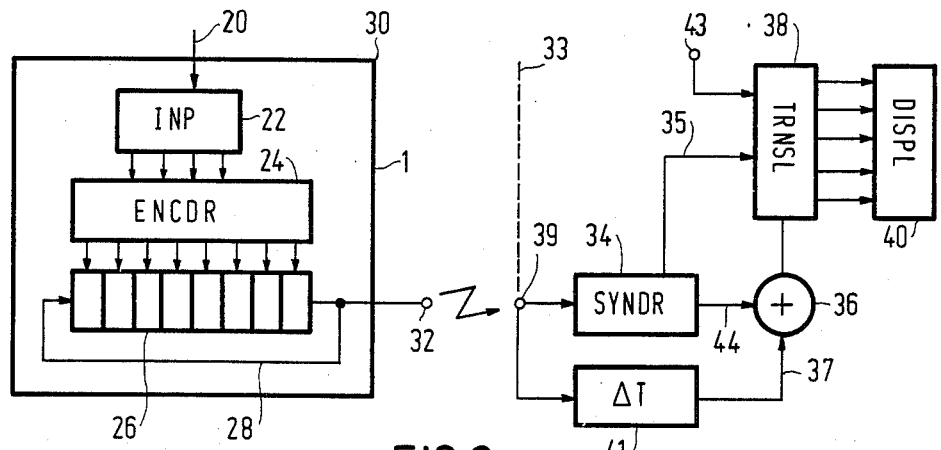
FIG. 1 shows a time diagram of a selectively activating paging system.
FIG. 2 shows a block diagram of a system in accordance with the invention.
FIG. 4 shows a generator matrix for an 8-bit code.
FIG. 5 shows a generator matrix for a 15-bit code.
FIG. 6 shows the parity check matrix for FIG. 5.

FIG. 1 shows a time diagram of the signals in a system comprising selectively activatable stations (paging system). Using an arbitrary scale, there is horizontally plotted the time during which the transmitting station may transmit messages at selectable instants for the selective activation of one or more receiving stations. The transmitting station first attempts to activate a receiving station A (the latter not being described in detail here). To this end, a code word reserved for the relevant station is transmitted three times in succession: A1, A2, A3. It may be that the receiving station A responds to code words other than its own reserved code word, for example, also to the code word "all stations". The transmitting station later attempts to activate the receiving station B by transmitting the code word reserved for this station three times in succession: B1, B2, B3. If the receiving station A has not yet responded after some time the code word associated with this station is transmitted three further times (for example, after an interval of five seconds).

FIG. 2 shows a block diagram of a system in accordance with the invention, for example, comprising selectively activatable receiving stations (paging system). An input 20 of the transmitting station 30 receives an identification of a receiving station. The input element 22, (for example, a register) receives this identification and presents it to an encoder 24. In this simple embodiment, this is shown as a 4-to-8 bit encoding operation. An example of such a 4-8 bit (n, k) code, in which $n=8$ and $k=4$, will be described hereinafter. Each code word has at least a predetermined minimum Hamming distance with respect to any other code word, including the cyclic transpositions of the other code word. When the minimum Hamming distance amounts to two bits, a single-bit error in a code word can always be detected. The 8-bit code word thus formed is stored in a shift register 26. Under the control of a clock system (not shown), the 8-bit code word is circulated three times by way of a feedback line 28 (this number may be a fixed constant for each system, but may differ for different systems). The bit presented to the line 28 is available for transmission. A 24-bit message is thus transmitted via the symbolically indicated broadcast channel 32. The modulation (NRZ, non-length limited, etc.) for adaptation to the physical properties of the channel has not been described for the sake of simplicity. The transmission and reception electronics have also been omitted for the sake of simplicity. Taken separately, this circuitry is of a conventional nature. The message thus comprises three code words which in the undisturbed condition are identical; however, it does not comprise additional synchronization words. The code bits are serially received at the receiving end and in the syndrome generator plus error pattern generator 34 a syndrome value is determined from a series of 8 successive code bits by means of the parity check matrix of the code to be described. To this end, the relevant error correction code must be linear. Non-linear codes are also permissible. In the latter case the translation from separated word to permissible code word is performed "directly", for example, by means of a permanently programmed translation or recognition element. The syndrome value is determined by way of matrix multiplication; this is a known technique. Implementation can be realized by means of EXCLUSIVE-OR-gate or by means of a read-only memory. Various conclusions can be drawn from the syndrome value:

a. For a first value of the syndrome, the word received is accepted as a correct, but possibly cyclically transposed code word, so that the original code word can be reconstructed. The case where this situation is caused by the presence of only a non-detectable error will be ignored. When no error is detected, the syndrome value consists, for example, exclusively of "zero" bits.

b. For a second category of values of the syndrome, a non-correctable error in the code word is indicated. The relevant signal appears on line 35 and blocks the operation of translation element 38. Via line 37, the translation element receives the code words delayed in delay element 41. When the translation element is not blocked, the code word is translated into the data word which is originally received on the line 20 and which is displayed on display element 40, for example, as a hexadecimal character. When the syndrome value indicates a non-correctable error, an indication may be given in a different way. Furthermore, the data word can be further processed in a manner (not shown) which is customarily used in systems comprising selectively activatable stations or systems incorporating transmitter recognition. The signal "O.K." (sub a. above) on the line 35 activates the translation of a code word once. Subsequently, the translation of further code words (which may be shifted versions of the word already translated) is blocked. The translation of a next code word may commence only after reception of a go-ahead signal on input 43, for example, from a management system not shown. The delay in the element 41 equals the period of time required for the time synchronization of the code word information and the associated syndrome value. For example, there may be a buffer having a length of one code word. In some cases, for example, when the syndrome value is formed by the addressing of a read-only memory, this extra delay will not be necessary as the mechanism for the serial filling of the address register of the memory then acts as such. The 8-bit code to be described hereinafter enables only the detection of one bit error in the code word, and in that case the element 36 may be omitted. However, if the code serves to correct also (or exclusively) bit errors in a code word, a third category of syndrome values occurs.

c. For a third category of syndrome values a correctable error in the code word is identified; from the syndrome value an error word is reconstructed which has the same length as the code word. Via line 44, this word is applied to the EXCLUSIVE-OR-element 36. Modulo-2 addition of error word and code word then produces a reconstructed code word.

Generally, codes having such a specifically defined minimum Hamming distance d between the sets associated with each code word are characterized by the following error correction/error detection properties:

if $d=2$, a single-bit error can be detected in each code word;

if $d=3$ in each code a single-bit error can be corrected or two single-bit errors can be detected;

if $d=4$, a single-bit error can be corrected in each code word, and moreover, a single-bit error can be detected or three single-bit errors can be detected; and so on for higher values of the minimum Hamming distance d of the complete code.

Depending on the minimum Hamming distance between a specific code word and all other code words, including their cyclic transpositions, the error detection/correction possibility may be more than minimum for exactly this specific code word. Such an "extra safe" code word can be selected for given important functions, for example, for the previously described signal, "all stations" in the case of selectively addressable stations. It also appears from the foregoing that sometimes either the case b or the case c does not occur for the relevant code, or is not used. The value of the minimum Hamming distance and, if applicable, the choice between correction and detection are dictated by the user's demands.

When, contrary to the foregoing, a non-linear code is used (in that case the sum of two code words need not always produce a new permissible code word), the decoder utilizes direct translation from disturbed code word to corrected code word or irrecognizable code word. An additional flag bit can then be used to indicate recognition or not or correction or not.

DESCRIPTION OF SOME CODES

Figure 3:
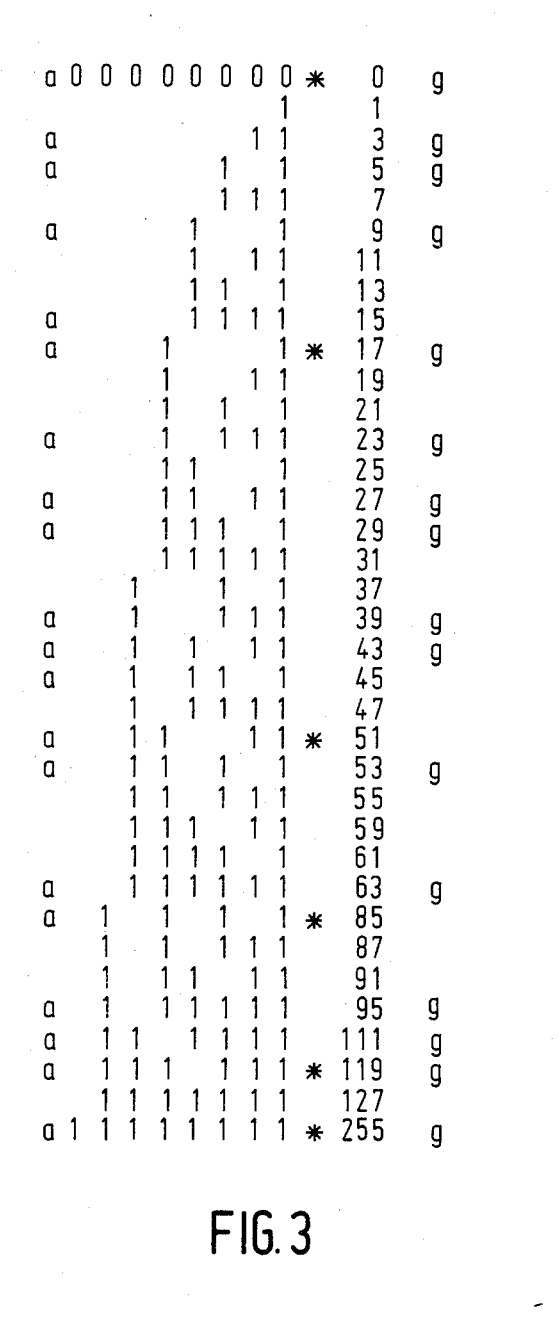

For the purpose of illustration, first and 8-bit code will be described. FIG. 3 shows all 36 cyclic equivalence classes, of those eight bits, once as a bit pattern and once as a decimal value. Cyclic transposition of a code word each time results in a word of the same cyclic equivalence class. For example, the code word (00001111)=15 also produces the further words: 30, 60, 120, 240, 225, 195, 135. The word of lowest value of each class is indicated. When this value equals m, the other words of this class have the values 2m (mod. 256), $2^2$m, $2^3$m etc., until the value m appears again. Most equivalence classes contain eight words; the classes which are denoted by an asterisk, however, contain fewer words (1, 2 or 4). In a non-disturbed situation, each of these cyclic equivalence classes can be recognized, thus enabling reconstruction of the associated code word, even when the words are presented in a direct, non-interrupted sequence, so that the beginning of the code word is not known. Thus, a number of five ($5 < {}^2$ln 36) data bits can be imaged on 8-code bits, at an overall Hamming distance equal to one: no detection or correction capability is thus provided.

Furthermore, the letters a. denote a sub-set of such cyclic equivalence classes, so that at least a Hamming distance of $d=2$ exists between a code word and any other code word, including the cyclic transpositions of the latter. This sub-set comprises twenty members and a number of four ($4 < {}^2$ln 20) bits can thus be imaged thereon. The relevant sub-set comprises all cyclic equivalence classes having an even number of "ones". Furthermore, the letters g. indicate a further sub-set of cyclic equivalence classes within the latter sub-set. This further sub-set comprises 16 members so that a data word of four bits can be imaged thereon. Moreover, this sub-set has the attractive property that it forms a linear code. The generator matrix (G) of this code is shown in FIG. 4. A linear code is distinguished by the fact that the sum (bit-wise modulo-2) of any combination of two code words results in a new code word. The code words formed from the data words belong to one of the equivalence classes denoted by the letter "g" in FIG. 3, but need not always be the representative of this equivalence class which is indicated in this Figure.

For the code under consideration it is a general rule that the code efficiency increases as the length of the code words increases. FIG. 5 shows a generator matrix for a fifteen-bit code. This generator matrix comprises a unity matrix with (11×11) elements. The lower section generates four redundancy bits for each code word. This section has been drafted taking into account the following limitations which are applicable to single-bit per code word error correction codes:

the number of redundancy bits (n-k) follows from the number of rows (n) and the number of columns (k) of the matrix. For the correction of an error: $2^{n-k} \geq (n+1)$. Hamming codes are optimum in the sense that $2^{n-k} = n+1$ for a given value of n. Such a theory for the standard codes (without taking into account cyclic equivalence classes) is known per se.

each column of the lower section contains at least two elements "1", because each code word should comprise at least three elements "1" (with the exception of the code word comprising only zeroes). This number "three" equals the minimum Hamming distance of the code.

each column of the lower section of the generator matrix is different.

The set of code words is found as follows: using the matrix of FIG. 5, the associated code words can each time be formed from $2^{11}=2048$ possible data words. These code words form a cyclic code which has a minimum Hamming distance of 3 and in which each cyclic transposition of a code word itself is also a code word. For each cyclic equivalence class only a single representative is included in the code; the number of such representatives thus amounts to 144, so that a seven-bit data word can be imaged thereon. FIG. 6 shows the parity check matrix (H) of this code. It is found as a matrix of $(n-k)$ rows and n columns. The first k columns are identical to the lower section of the generator matrix of FIG. 5. The last $(n-k)$ columns form a unity matrix. Assume, by way of example, that the receiver reads the code word:

$$c=111001001000010.$$

The four-bit syndrome is found as:

$$s=(S_1\ldots S_3)=(H).c=(1111)^T.$$

The syndrome thus calculated is equivalent to the modulo-2 sum of the parity bits generated at the transmitting end and there received in the code word. The value of the syndrome is equal to the third column of the parity check matrix (H) and thus acts as an error locator for the third bit. The error locator is identical to the error vector and the correction is found by modulo-2 addition of the error vector to the code word.

$$\frac{\begin{array}{r}111001001000010\\001000000000000\end{array}+}{110001001000010}$$

The 11 extreme left bits form the pseudo-value of this (possibly shifted) code word, the extreme left bit then being the least-significant bit. This pseudo-value is: $1+2+32+256=291$. However, the list only has the code word having the lowest pseudo-value of each cyclic equivalence class. Transposition over two bits to the left produces this lowest pseudo-value:

000100100001011.

or $8+64=72$ (the redundancy bits are not taken into account for this purpose). Via the list number in the list of cyclic equivalence classes, the associated data word can be reconstructed. Using the code of the FIGS. 5, 6 a single-bit error in an arbitrary position can thus be corrected.

FIG. 7 shows the generator matrix ($G_z$) and the parity check matrix ($H_z$) of a cyclic (17, 9) code having a minimum Hamming distance 5 which is thus capable of correcting two single-bit errors (or can realize one of the possibilities already described for this minimum Hamming distance). For the lower 8 rows of the matrix ($G_z$), it is applicable that, when read backwards, the tenth row produces the same result as the seventeenth row etc. for the combinations eleventh/sixteenth row, twelfth/fifteenth row, and thirteenth/fourteenth row. This mirror effect, of course, is also applicable to the first nine columns of the parity check matrix ($H_z$) (the fifth column offers the same result when read backwards). This is a code which is known per se and which will be effectively used herein in a manner yet to be described. The correction properties are conventional, so that cyclic transpositions may not be taken into account.

As a continuation of FIG. 7, FIG. 8 shows the generator matrix ($G_{zs}$) and the parity check matrix ($H_{zs}$) of a linear sub-code of the code associated with FIG. 7. This "association" means that each code word of this sub-code is a unique representative of a cyclic equivalence class of the original code. The first five rows of the generator matrix form an identify matrix, and the last five rows form a juxtaposed identity matrix; furthermore, all columns are invariant against reading from the bottom upwards. The relationship between the parity check matrix and the generator matrix is expressed in known manners. In this code, the minimum Hamming distance between the various cyclic equivalence classes equals five, so that two single-bit errors in a code word can be corrected; the code is acyclic, which means that not one cyclic transposition of a code word can produce another code word.

FIG. 9 is a detailed representation of a part of a decoder. The (possibly disturbed) information arrives on input 100 and is successively stored in a shift register which consists of three sections 102, 104, 106. Each section has a storage capacity which suffices for an entire code word. Synchronizing clock control has been omitted for the sake of simplicity. Each time four corresponding bit positions of a code word are applied to the bit extractor 108. The set-up shown, of course, makes sense only if the code word is transmitted at least four times in direct succession, once more than in the situation of FIG. 1. The bit extractor 108 each time receives four code bits and provides a first estimation of the "true" value of this code bit on output 110, and also provides a reliability indication on output 112. In this case the "true" value is determined as a majority decision between the four code bits received. The reliability is "good" if at least three directly successive code bits have the same value, so for the following six combinations of code bits: 0000, 0001, 1000, 0111, 1110, 1111. In all other (ten) cases, the reliability is "poor". The "assumed" code bits are successively stored in register 114 and the reliability indications are successively stored in register 116. Decoder 118 implements the decoding algorithm of the cyclic code by means of the parity check matrix ($H_z$) of FIG. 7. Thus, at the most two bit errors can be corrected in the same way as already described with reference to FIGS. 5, 6 for a single-bit correction code. If desirable, use may be made of the reliability indications in the register 116. These reliability indications are then taken into account by a reliability decoder 120. A simple possibility is that this decoder produces a blocking signal for blocking the decoding on the line 122 in the case of an excessive number of "poor" reliability indications. This is done, for example, when three or more values "poor" have occurred. It is also possible to indicate the unreliable code bits and to generate a blocking signal when instead of these code bits one or two other code bits are corrected. Finally, the reliability indications may be used as locators for the corrections to be performed. For example, the second estimation of a code word appears on the output of the decoder 118; for the sake of simplicity, this code word is indicated as consisting of four bits in this case. These bits are stored in the register 121. After completion of storage, the content of this register 121 is circulated once via feedback line 123. For the duration of this circulation, the production of new output information by the decoder 118 is blocked. A word recognizer 124 is connected to the register 121. In this simplified diagram, this recognizer is shown to operate on only three bits (in the case of FIG. 7, nine bits would be concerned). The reconstructed message having a length of k bits subsequently appears in output register 126.

FIG. 10 shows a second part of a decoder for use with the codes of FIGS. 7, 8. The reference numeral 140 denotes a register whose function corresponds to that of the register 121 of FIG. 9 and which, therefore, receives the provisionally corrected code via an input which is shown as a serial input in this case. Element 144 is a decoder for the code defined by FIG. 7. This code has been described in combination with the code according to the FIGS. 5, 6. This treatment can very well be serially performed. A two-way switch 146 is connected to the output of the decoder 144. In one position, the seventeen-bit code word is stored in the register 148 which has a capacity of seventeen bits. The detection of a valid data word is performed by eight EXCLUSIVE-OR gates such as the element 150; therein, the following bits are pair-wise added 1/17, 2/16, 3/15, 4/14, 5/13, 6/12, 7/11, 8/10. The results are applied to a NOR-gate 152 having a width of 8 bits; this gate outputs a logic "1" if the above bits pair-wise have the same value. If this is so, a "data valid" signal appears on output 154. After reception of a seventeen-bit code word in the register 148, switch 146 is set to the upper position so that the code word circulates in the same way as already described for the register 121 of FIG. 9. When the signal on output 154 indicates that a valid data word is present, the data word itself is found as the first five code bits in the register 148: output 156.

What is claimed is:

1. A system for transmitting messages over a message channel comprising:
   a transmitting station including:
   means for generating a message as a succession of a mutually identical multibit code words which utilizes a small portion of said message channel; said code words including at least one word dedicated to a particular receiving station and having a minimum Hamming-distance of at least two with respect to the remaining code words inclusive of a cyclical transposition of the latter; and
   a receiving station including:
   (a) separation means connected to said message channel for extracting a message therefrom;
   (b) a decoder connected to said separation means for decoding said message, said decoder having a decision means for windowless detection of any word equal in length to at least one of said multibit code words and for indicating at least one code word.

2. A system as claimed in claim 1 wherein said at least one code word has a minimum Hamming distance in the bit space of at least three bits with respect to any other permissible code word, including the latter's cyclic transpositions, the decision means being capable of correcting at least one bit error in a separated n-bit word.

3. A transmitting station for use in a system as claimed in claim 1 or 2, wherein the one code word identifies the transmitting station.

4. A receiving station for use in conjunction with a transmitting station as claimed in claim 3 and based on a linear code, wherein the decision means comprise multiplier means for forming, using a parity check matrix, a syndrome value in order to reconstruct a code word from the separated word and the syndrome value.

5. A transmitting station for use in a system as claimed in claim 1 or 2, wherein the transmitting station is suitable for the transmission of several, different code words in order to selectively activate a receiving station which is identified by an associated code word.

6. A transmitting station as claimed in claim 5, wherein the set of permissible code words forms a non-linear code.

7. A receiving station for use in conjunction with a transmitting station as claimed in claim 5 wherein said decoder comprises means for forming an internal activation signal under the control of said message indicating a valid code word.

8. A system for communicating over a message channel comprising:
   a transmitting station for supplying a message to said channel, said message including a number of mutually identical code words, each code word including a plurality of bits and a Hamming distance greater or equal to 2 with respect to the remaining code words, including transpositons of said remaining code words;
   a receiving station connected to said message channel including:
   a windowless decoder for extracting from said channel said number of mutually identical code words;
   a syndrome detector connected to receive decoded words from said decoder for producing a syndrome value and an error code;
   a delay circuit connected to receive decoded words from said decoder;
   translation means for converting decoded words into a data word when enabled by said syndrome value; and
   means for combining an error code and code word from said syndrome detector and a delay circuit to produce a corrected code for said translation means, whereby non-correctable words result in a first syndrome value which inhibits said translation means from being enabled, and a second syndrome value indicates said code word is to be corrected and enables said translation means.

* * * * *

UNITED STATES PATENT AND TRADEMARK OFFICE
CERTIFICATE OF CORRECTION

PATENT NO. : 4,541,095
DATED : 9/10/85
INVENTOR(S) : LODEWIJK B. VRIES

It is certified that error appears in the above-identified patent and that said Letters Patent is hereby corrected as shown below:

Column 9, Claim 1, line 39, delete "a"; third occurrence.

Column 10, Claim 8, line 34, change "transpositons" to --transpositions--.

Signed and Sealed this

Seventeenth Day of December 1985

[SEAL]

Attest:

Attesting Officer

DONALD J. QUIGG

Commissioner of Patents and Trademarks